United States Patent
Kitagawa et al.

[11] Patent Number: 6,129,100
[45] Date of Patent: Oct. 10, 2000

[54] WAFER CLEANING APPARATUS AND STRUCTURE FOR HOLDING AND TRANSFERRING WAFER USED IN WAFER CLEANING APPARATUS

[75] Inventors: Kenichi Kitagawa; Kiyoshi Shimada; Ei'ichi Ando; Tatsuo Kataoka; Takashi Yoneda; Yoshihito Tatehaba, all of Chofu, Japan

[73] Assignee: Hoya Corporation, Japan

[21] Appl. No.: 09/177,939

[22] Filed: Oct. 23, 1998

[30] Foreign Application Priority Data

| Jan. 13, 1998 | [JP] | Japan | 10-004719 |
| Jun. 10, 1998 | [JP] | Japan | 10-162242 |
| Jun. 26, 1998 | [JP] | Japan | 10-181038 |

[51] Int. Cl.[7] .................................................... B08B 3/00
[52] U.S. Cl. ................... 134/61; 134/94.1; 134/100.1; 134/902; 134/113; 134/157
[58] Field of Search ............... 134/902, 100.1, 134/94.1, 61, 62, 157, 151, 25.4, 113; 222/52; 137/895

[56] References Cited

U.S. PATENT DOCUMENTS

| 2,604,108 | 7/1952 | Considine . | |
| 4,241,877 | 12/1980 | Highes | 239/405 |
| 4,274,812 | 6/1981 | Elvidge et al. | 417/179 |
| 4,366,003 | 12/1982 | Korte et al. | 134/18 |
| 4,688,918 | 8/1987 | Suzuki et al. | 354/325 |
| 4,787,404 | 11/1988 | Klosterman et al. | 134/198 |
| 4,917,123 | 4/1990 | McConnell et al. | 134/95 |
| 4,919,853 | 4/1990 | Alvarez et al. | 264/12 |
| 5,061,406 | 10/1991 | Cheng | 261/76 |
| 5,108,778 | 4/1992 | Suzuki et al. | 427/38 |
| 5,129,241 | 7/1992 | Kiuchi et al. . | |
| 5,172,572 | 12/1992 | Ono . | |
| 5,370,746 | 12/1994 | Pedersen et al. | 134/22.1 |
| 5,411,042 | 5/1995 | Suzuki et al. . | |
| 5,487,398 | 1/1996 | Ohmi et al. | 134/95.1 |
| 5,498,294 | 3/1996 | Matsushita et al. | 134/6 |
| 5,518,542 | 5/1996 | Matsukawa et al. | 118/52 |
| 5,520,744 | 5/1996 | Fujikawa et al. | 134/11 |
| 5,545,073 | 8/1996 | Kenisel et al. | 451/39 |
| 5,578,127 | 11/1996 | Kimura | 118/695 |
| 5,599,372 | 2/1997 | Pommier . | |
| 5,672,230 | 9/1997 | Park et al. . | |
| 5,701,627 | 12/1997 | Matsumura et al. | 15/88.2 |
| 5,704,990 | 1/1998 | Krambrock et al. | 134/22.12 |
| 5,706,842 | 1/1998 | Caimi et al. | 134/113 |
| 5,722,441 | 3/1998 | Teramoto . | |
| 5,730,806 | 3/1998 | Caimi et al. | 134/22.12 |
| 5,776,296 | 7/1998 | Matthews | 156/345 |
| 6,015,718 | 1/2000 | Rathbone . | |

FOREIGN PATENT DOCUMENTS 4415823  9/1995  Germany .

*Primary Examiner*—Frankie L. Stinson
*Attorney, Agent, or Firm*—Cook, Alex, McFarron, Manzo, Cummings & Mehler, Ltd.

[57] ABSTRACT

A transfer robot 2 for holding the peripheral edge of a wafer 1 and transferring the wafer 1, a turning-over alignment section 7 for turning over the wafer 1 and centering the wafer 1, and a transfer robot cleaning section 6 for cleaning holding portions 2a of the transfer robot 2 are provided. Besides, a wafer cleaning section 5 for cleaning the wafer 1 is provided and in this wafer cleaning section 5, a spinner 22 for chucking the wafer 1 and a nozzle 20 through which a cleaning liquid is jetted to this wafer 1. To this nozzle 20, a tank 11 for pure water for supplying pure water, a tank 12 for functional water for supplying a functional water, a tank 13 for chemical liquid for supplying a chemical liquid, and a cleaning liquid mixing portion 14 for storing these various kinds of cleaning liquids and mixing them are connected through supply lines.

21 Claims, 6 Drawing Sheets

WAFER CLEANING APPARATUS AND STRUCTURE FOR HOLDING AND TRANSFERRING WAFER USED IN WAFER CLEANING APPARATUS

REFERENCE TO RELATED APPLICATIONS

This application claims the priority rights under 35 U.S.C. 119 of Japanese Patent Application Nos. Hei10-4719 filed on Jan. 13, 1998, Hei10-162242 filed on Jun. 10, 1998 and Hei10-181038 filed on Jun. 26, 1998, the entire disclosure of which is incorporated herein by reference.

BACKGROUND OF THE INVENTION (i) Field of the Invention

The present invention relates to a wafer cleaning apparatus and a structure for holding and transferring a wafer used in the wafer cleaning apparatus. In particular, it relates to a wafer cleaning apparatus in which the surface of a transferred wafer is cleaned with particles of ice obtained by jetting a cleaning liquid through a nozzle at a supersonic speed, and a structure for holding and transferring a wafer used in the wafer cleaning apparatus.

(ii) Description of the Related Art

In manufacturing ULSIs, the yield and the quality of the products are remarkably lower if contaminants such as particles adhere to the surface of a wafer during the manufacturing step. For this reason, it is necessary to make the efficiency of the technique for cleaning the wafer surface higher. Recently, in the semiconductor industry, the influence of contaminants, such as particles, on the yield of the products has become considerable because of the demand for larger-scale integration on the silicon wafer.

The present applicant has already filed Japanese Patent Application No. Hei9-19375 as a highly efficient cleaning technique for cleaning the surface of a wafer. A wafer cleaning apparatus disclosed therein is provided with a jet orifice such as a Laval nozzle, through which minute particles of ice are jetted to the wafer surface to remove adhering contaminants.

FIG. 7 is a perspective view of such a semiconductor wafer cleaning apparatus for cleaning the surface of a wafer with ice particles jetted. As shown in FIG. 7, this semiconductor wafer cleaning apparatus comprises a transfer robot 32 disposed near the center of the apparatus, for transferring a wafer 31. The wafer 31 is loaded on the transfer robot 32 and unloaded from it. The apparatus also includes a loader 33 for receiving the wafer 31 before cleaning, an unloader 34 for receiving the wafer 31 after cleaning, an alignment 37 disposed between the loader 33 and the unloader 34 for adjusting the position of the wafer 31, and a cleaning section 35 for cleaning the wafer 31. The cleaning section 35 includes a spinner 42 for holding the wafer 31 by vacuum chuck and rotating it, a nozzle 40 for jetting a cleaning liquid to the surface of the rotating wafer 31 to clean it, and a discharge cup 44 surrounding the periphery of the spinner 42 so as to prevent the cleaning liquid jetting through the nozzle 40 from flying in to the surroundings. Operation buttons 38 are provided near the loader 33 for operating the apparatus in a predetermined cleaning condition. A personal computer 39 is provided near the operation buttons 38 for analyzing the cleaning condition and displaying the result.

The transfer robot 32 is disposed near the center of the apparatus and provided with a chuck portion for chucking the wafer 31 by vacuum. The chuck portion of this transfer robot 32 is movable between the front and the rear. The transfer robot 32 is rotatable around a predetermined axis in 360°. The transfer robot 32 is thus designed so that it can hold the wafer 31 by vacuum chuck and transfer the wafer 31 to any of the loader 33, the unloader 34, the cleaning section 35 and the alignment 37, which are provided in the periphery, for performing a cleaning operation.

To the loader 33 provided in the periphery of the transfer robot 32, a wafer cassette (not shown), for receiving a plurality of wafers 31 before cleaning, is transferred from a predetermined section. Another wafer cassette (not shown), for receiving the wafers 31 after cleaning, is put in the unloader 34. The alignment 37 is provided between the loader 33 and the unloader 34. The alignment 37 is for detecting the center of the wafer 31 loaded by the transfer robot 32 and performing the centering adjustment of the wafer 31. The cleaning section 35 is provided near the loader 33 for cleaning the wafer 31.

The cleaning section 35 is provided with the spinner 42 for chucking the wafer 31 transferred from the loader 33 by being chucked by the transfer robot 32. The spinner 42 for chucking the wafer 31 is supported so as to be rotatable and engaged with a drive source, such as a motor. In this manner, the center of the wafer 31 is detected by the alignment 37, and the wafer 31 is centered. The wafer 31 is then fixed to the spinner 42 in the state that the center of the wafer 31 coincides with the center of the spinner 42 which is supported so as to be rotatable. The cleaning section 35 includes the nozzle 40 for cleaning the wafer 31 by jetting the cleaning liquid to the wafer 31 which is chucked by the spinner 42 and rotating with the spinner 42.

A through hole (not shown) is formed in the nozzle 40 for supplying compressed air from an air supply apparatus (not shown) provided in the exterior. The through hole is tapered toward the tip end near the bottom to form a Laval nozzle. The through hole of the nozzle 40 is designed so that pure water can be supplied in the middle of the through hole. The pure water is supplied to the through hole with a predetermined hydraulic pressure. In this nozzle 40, pure water and compressed air are supplied to the through hole, and the pure water is jetted through the tip of the nozzle 40 having the shape of Laval nozzle with a predetermined hydraulic pressure. As a result, at the tip of the nozzle 40, while the flow speed of the pure water increases, the pressure drops rapidly. The pure water is thus adiabatically expanded, and the temperature drops. The pure water supplied to the tip of the nozzle 40 thus transforms into ice particles because of the temperature drop. The ice particles are then jetted out of the tip of the nozzle 40. Under the nozzle 40 through which the ice particles are jetted, the wafer 31 chucked by the spinner 42 and rotating with the spinner 42 is located. The cleaning is carried out by making the ice particles collide to the surface of the wafer 31.

In the cleaning section 35, the discharge cup 44 surrounding and covering the periphery of the spinner 42 is provided so as to prevent the cleaning liquid jetted through the nozzle 40 from flying in to the surroundings. The discharge cup 44 has an opening in the upper surface so that the transfer robot 32 transferring the wafer 31 to the spinner 42 can easily perform the loading or unloading operation.

The operation buttons 38 for operating the apparatus are provided near the loader 33. The apparatus can be controlled by selecting the cleaning condition for the wafer 31 through the operation buttons 38. The wafer 31 is cleaned in the apparatus in accordance with the cleaning condition selected through the operation buttons 38. The personal computer 39 is provided near the operation buttons 38. The personal computer 39 is for displaying information obtained by simulating and analyzing the cleaning operation. The apparatus can therefore be operated in a predetermined condition, in light of the condition that is input through the operation buttons 38, on the basis of information obtained through the personal computer 39.

Next, the operation of cleaning the wafer in the wafer cleaning apparatus illustrated above will now be described. First, a wafer cassette, which received a plurality of wafers 31 before cleaning, is transferred from a predetermined section and put in the upper portion of the loader 33. Another wafer cassette, which received no wafers is put in the upper portion of the unloader 34. After placing the wafer cassettes, a predetermined condition is input through the operation buttons 38 on the basis of information obtained through the personal computer 39, and then the apparatus is started. After starting the apparatus, the transfer robot 32 moves toward the loader 33 to take out a wafer 31 from the loader 33 by vacuum chuck and transfer the wafer 31 to the alignment 37.

The wafer 31 transferred to the alignment 37 is centered by detecting the center of the wafer 31 and then transferred to the upper portion of the spinner 42 by the transfer robot 32 to be chucked so that the center of the wafer 31 coincides with the center of the spinner 42. After chucking the wafer 31, the spinner 42 is rotated, and pure water and compressed air are supplied to the nozzle 40. The pure water supplied to the nozzle 40 is thereby pressurized by the compressed air and accelerated at the tip of the nozzle 40 and then jetted out of the tip. Near the nozzle 40, the pure water is adiabatically expanded to drop the temperature, and as a result, ice particles are formed.

Under the nozzle 40 through which the ice particles are jetted, the wafer 31 rotating with the spinner 42 is located. The cleaning is carried out by making the ice particles collide to the surface of the wafer 31. The nozzle 40 is moved from the center to the circumference of the wafer 31 as the ice particles are jetted from above the rotating wafer 31. The wafer 31 is thus cleaned by blowing away contaminants such as particles.

After completing the cleaning of the wafer 31, the rotation of the spinner 42 and the jet from the nozzle 40 are stopped. At the same time, the transfer robot 32 chucks the wafer 31 on the spinner 42 and then transfers it to the wafer cassette in the unloader 34. The wafer cassette receives the wafer 31. By repeating such a cleaning operation as described above, all of the wafers 31 received in the wafer cassette in the loader 33 are cleaned.

In this manner, the wafer cleaning apparatus shown in FIG. 7 effectively cleans a semiconductor wafer by removing contaminants from the surface of the wafer with ice particles jetted through the nozzle.

In this wafer cleaning apparatus, however, a high rate of cleaning can not be obtained for removing stable contaminants, such as alien substances and metallic contaminants adhering to the wafer surface, because the cleaning liquid to be jetted consists of only pure water.

Further, because the cleaning is performed in the state of chucking the back surface of the wafer by the spinner 42, it is hard to remove all the contaminants using the jet through the nozzle, if the back surface of the wafer chucked is contaminated. It is also hard to clean the wafer after it has turned over.

Additionally, the transfer robot 32 accumulates the contaminants by chucking the wafer. Hence, there is a possibility that a newly chucked wafer is contaminated.

Furthermore, even in case of providing the discharge cup, it is difficult to fully discharge minute liquid drops which collided against the wafer surface and scattered. As a result, there is a possibility that the contaminated liquid again adheres to the wafer.

SUMMARY OF THE INVENTION

It is an object of the present invention to provide a wafer cleaning apparatus, in which the front and back surfaces of a semiconductor wafer can effectively be cleaned and the wafer can be prevented from being contaminated, and a structure for holding and transferring a wafer used in the wafer cleaning apparatus.

A wafer cleaning apparatus according to the present invention, in which a wafer is transferred by a transfer section and cleaned using a cleaning liquid such as pure water, jetted to the wafer through a jet orifice having a Laval nozzle shape at a supersonic speed by accelerating with compressed air, comprising the transfer section for holding the peripheral edge of the wafer and transferring the wafer to a predetermined place, a turning-over alignment section for centering the wafer transferred by the transfer section and for turning over the wafer, a cleaning section in which a spinner is provided for chucking the wafer transferred by the transfer section and rotating the wafer, a cleaning liquid jetted to the wafer chucked by the spinner through a jet orifice to clean the wafer, a discharge port is provided for discharging minute liquid drops of the cleaning liquid scattered to one side opposite to the jet orifice, and a supply section which includes a plurality of storing portions for storing various kinds of cleaning liquids for cleaning the wafer so as to supply selectively any of the cleaning liquids to the jet orifice under pressure in accordance with the condition of the contamination of the wafer.

The storing portions of the supply section may include a pure water storing portion for supplying pure water, a functional water storing portion for supplying a functional water such as ozonic water and electrolytically ionic water, and a liquid chemical storing portion for supplying a liquid chemical. The supply section may include a cleaning liquid mixing portion for receiving various kinds of cleaning liquids from the storing portions and mixing them at predetermined rates and then supplying the mixture liquid to the jet orifice. A transfer cleaning section may be provided for cleaning the wafer holding portions of the transfer section for holding the peripheral edge of the wafer. The discharge port of the cleaning section may be provided with a local discharge device having a mechanism for moving with the movement of the jet orifice having the Laval nozzle shape. The tip of the jet orifice having the Laval nozzle shape is preferably formed into a taper tube for accelerating liquid drops.

DETAILED DESCRIPTION OF THE PREFERRED EMBODIMENT

Figure 1:
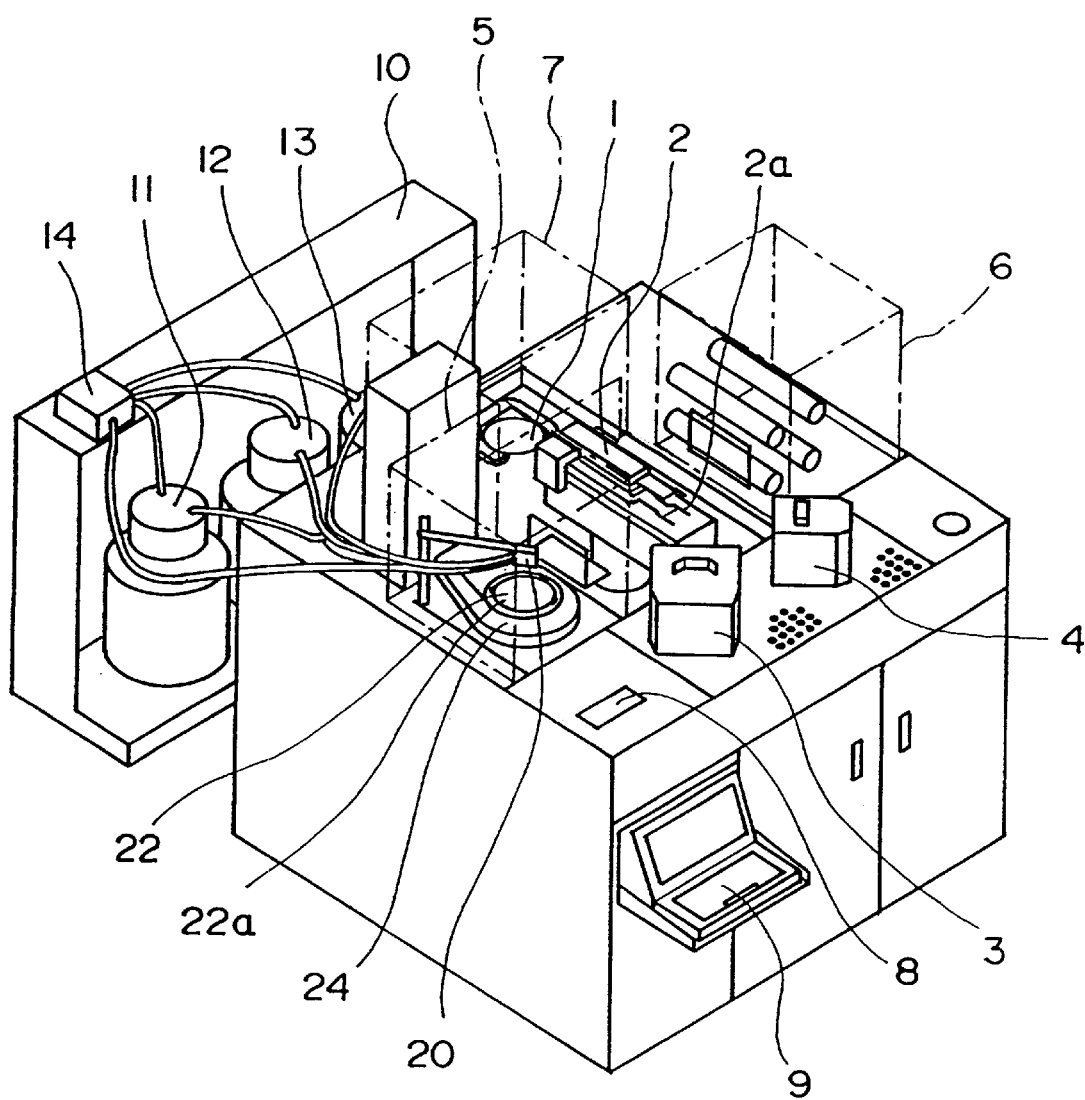
FIG. 1 is a perspective view of a wafer cleaning apparatus according to an embodiment of the present invention.

Hereinafter, a wafer cleaning apparatus and a structure for holding and transferring a wafer used in the wafer cleaning apparatus according to an embodiment of the present invention will be described in detail, with reference to drawings. FIG. 1 is a perspective view of a wafer cleaning apparatus according to an embodiment of the present invention.

As shown in FIG. 1, the wafer cleaning apparatus according to an embodiment of the present invention includes the following: a transfer robot 2 disposed near the center of the apparatus for transferring a wafer 1 which is loaded to the transfer robot 2 and unloaded from it, a loader 3 for receiving the wafer 1 before cleaning, an unloader 4 for receiving the wafer 1 after cleaning, a turning-over alignment section 7 disposed on one side opposite of the loader 3 and the unloader 4, a wafer cleaning section 5 for cleaning the wafer 1, and a transfer robot cleaning section 6 disposed on one side opposite of the wafer cleaning section 5 for cleaning the holding portions 2a of the transfer robot 2.

The wafer cleaning section 5 includes a spinner 22 for chucking the wafer 1 and a nozzle 20 for jetting a cleaning liquid to the spinner 22. The nozzle 20 is connected to a tank 11 for pure water, a tank 12 for functional water and a tank 13 for chemical liquid through supply lines. The tank 11 for pure water, the tank 12 for functional water and the tank 13 for liquid chemicals liquid are connected to a cleaning liquid supply section 10. The cleaning liquid supply section 10 includes a cleaning liquid mixing portion 14, wherein cleaning liquids can be mixed for supply to the nozzle 20.

In this embodiment, operation buttons 8 are provided for operating the apparatus in a predetermined cleaning condition. A personal computer 9 is provided near the operation buttons 8 for analyzing the cleaning condition and displaying the result.

Figure 2:
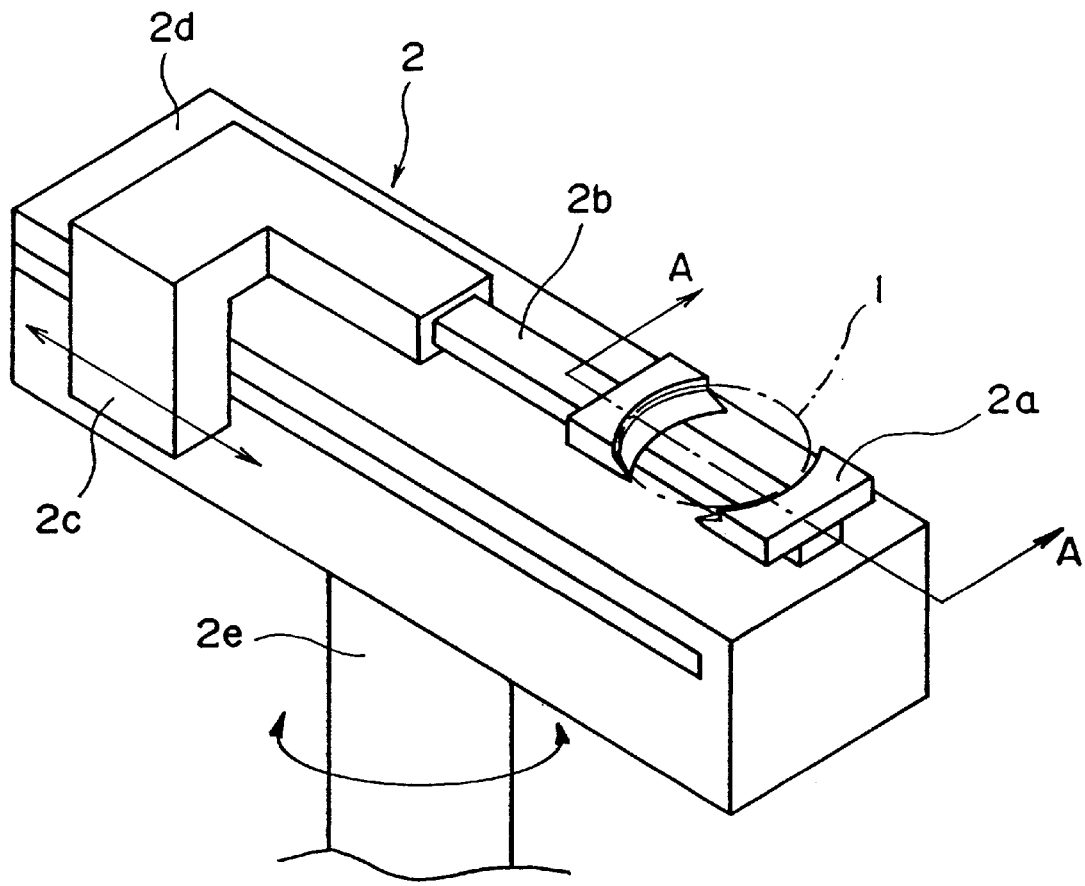
FIG. 2 is a perspective view of a structure for holding and transferring a wafer used in the wafer cleaning apparatus according to the present invention.
Figure 3:
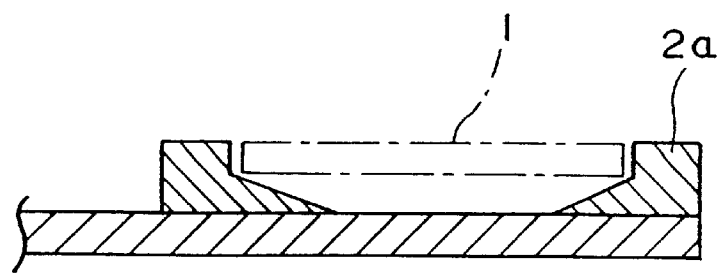
FIG. 3 is a cross-sectional view taken along line A—A in FIG. 2.

The transfer robot 2 is disposed near the center of the above described wafer cleaning apparatus. The transfer robot 2 is provided with holding portions 2a for holding the peripheral edge of the wafer 1 for transfer. FIGS. 2 and 3 show an example of the structure for holding and transferring a wafer of the transfer robot 2 used in the wafer cleaning apparatus, according to the present invention, shown in FIG. 1. FIG. 2 is a perspective view of an example of the structure for holding and transferring a wafer used in the wafer cleaning apparatus according to the present invention. FIG. 3 is a cross-sectional view taken along line A—A in FIG. 2.

As shown in FIG. 2, the structure for holding and transferring a wafer used in the wafer cleaning apparatus is applied to the transfer robot 2 and provided with the holding portions 2a for holding the peripheral edge of the wafer 1 for transfer. The transfer robot 2 includes a base 2d and a movable portion 2c movable to the front and the rear on the upper portion of the base 2d. The movable portion 2c has an arm 2b which extends forward. The bottom of the base 2d is supported by a shaft 2e. The shaft 2e is rotatable in 360° so that the base 2d and the arm 2b are freely rotatable. The holding portions 2a for holding the peripheral edge of the wafer 1 is formed at the tip of the arm 2b. A pair of holding portions 2a are disposed in parallel opposite each other on both sides of the wafer 1. The inside surfaces of the holding portions 2a, which are opposite to each other, are circular in order to fit the peripheral edge of the wafer 1. These inside surfaces include a notch having a bottom surface which extends toward the center of the inside near the bottom and is inclined downward.

In the above-identified transfer robot 2, the wafer 1 is fitted between the pair of holding portions 2a oppositely disposed, as shown in FIG. 3. At this time, because the inclined bottom surfaces of the holding portions 2a support the peripheral edge of the wafer 1, the central portion of the back surface of the wafer 1 is not contaminated. In this manner, the transfer robot 2 can transfer the wafer 1 to any of the loader 3, the unloader 4, the wafer cleaning section 5 and the turning-over alignment section 7, without contamination if the cleaning operation.

Referring again to FIG. 1, the loader 3 is provided near the transfer robot 2 for receiving the wafer 1 transferred from a predetermined section. The loader 3 receives a wafer cassette (not shown) receiving a plurality of wafers 1, before cleaning; transferred from the predetermined section. The unloader 4 is provided near the loader 3. The unloader 4 receives another wafer cassette (not shown) for receiving the wafers 1 after cleaning. The turning-over alignment section 7 is provided at the position opposite to the loader 3 and the unloader 4.

The turning-over alignment section 7 is for detecting the center of the wafer 1 transferred by the transfer robot 2 and centering the wafer 1, and for turning over the wafer 1 by chucking the peripheral edge of the wafer 1. The turning-over alignment section 7 is designed so as to center the wafer 1 and turn over the wafer 1 by chucking the peripheral edge of the wafer 1. In this manner, the turning-over alignment section 7 chucks the peripheral edge of the wafer 1 to prevent contamination and additionally both surfaces of the wafer 1 can be cleaned by turning over the wafer 1. The wafer cleaning section 5 is provided near a side surface of the turning-over alignment section 7 for removing contaminants adhering to the surface of the wafer 1.

The wafer cleaning section 5 includes the spinner 22 for chucking the wafer 1 transferred from the loader 3 by the transfer robot 2.

Figure 4:
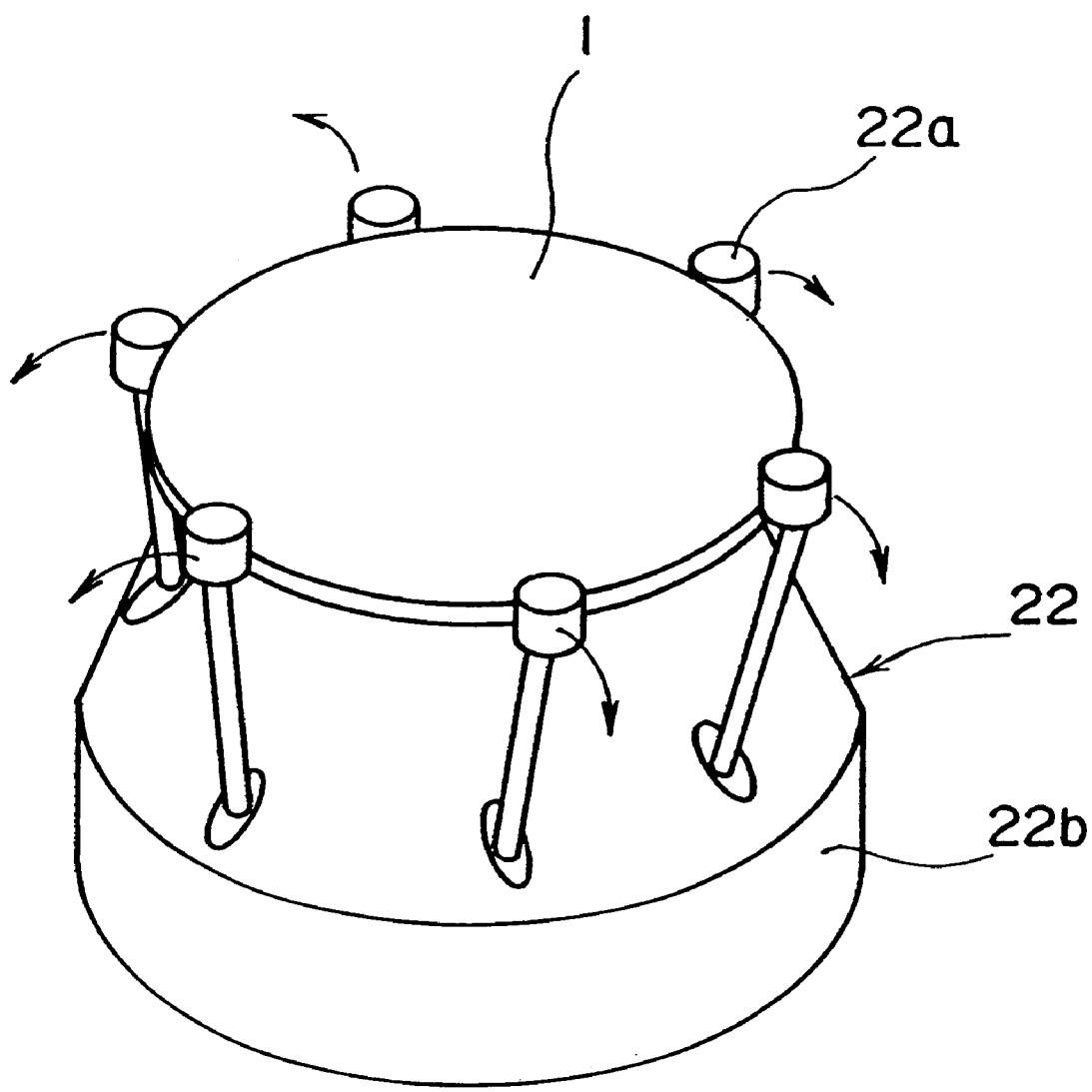
FIG. 4 is a perspective view of the spinner shown in FIG. 1.
Figure 7:
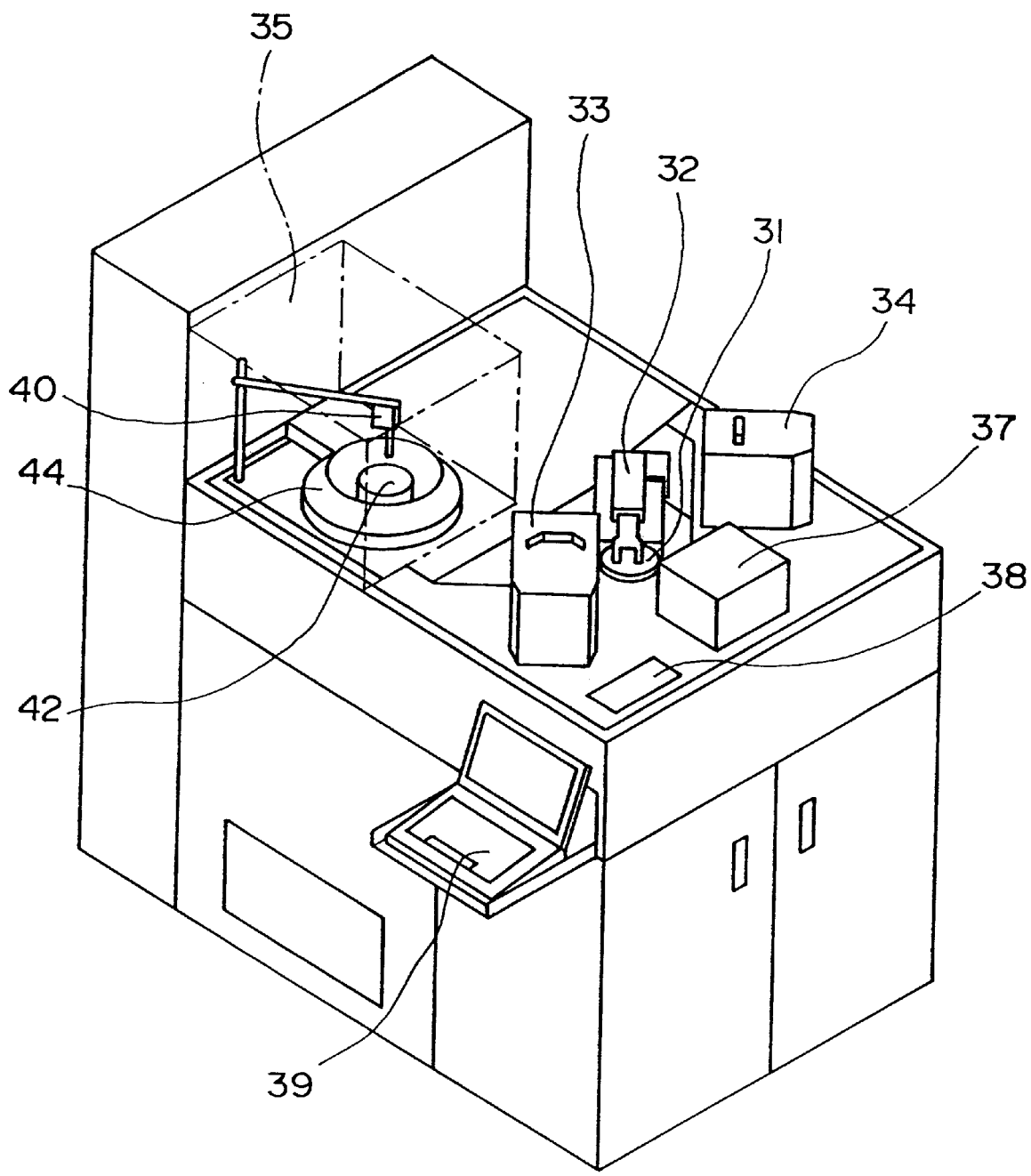
FIG. 7 is a perspective view of a related art wafer cleaning apparatus.

FIG. 4 is a perspective view of the spinner 22 shown in FIG. 1. As shown in FIG. 4, the spinner 22 does not chuck the wafer 1 by vacuum chuck but has a plurality of spinner chucks 22a for chucking the peripheral edge of the wafer 1, unlike the wafer cleaning apparatus shown in FIG. 7. The plurality of spinner chucks 22a is provided on a rotatable base 22b. The rotatable base 22b is supported so as to be rotatable and engages with a drive source such as a motor to be rotated at a predetermined speed. The spinner chucks 22a can be opened and closed in the radial direction of the rotatable base 22b. In this manner, the spinner chucks 22a are closed to chuck the wafer 1, and the chucked wafer 1 rotates with the rotation of the rotatable base 22b. According to the spinner 22 constructed as above, because the wafer 1 rotates in the state that the peripheral edge of the wafer 1 is chucked, the central portion of the wafer 1 is prevented from being contaminated through the spinner 22.

The wafer cleaning section 5 includes the nozzle 20 for jetting a cleaning liquid to the wafer 1 chucked by the spinner 22 and rotating to clean the wafer 1. Compressed air is supplied to the nozzle 20 from an air supply apparatus (not shown) disposed in the exterior. A cleaning liquid can be supplied to the nozzle 20 through a supply line. A through hole (not shown) is formed in the nozzle 20 for jetting the supplied cleaning liquid. This through hole is tapered toward the tip end to form a Laval nozzle shape.

Figure 5:
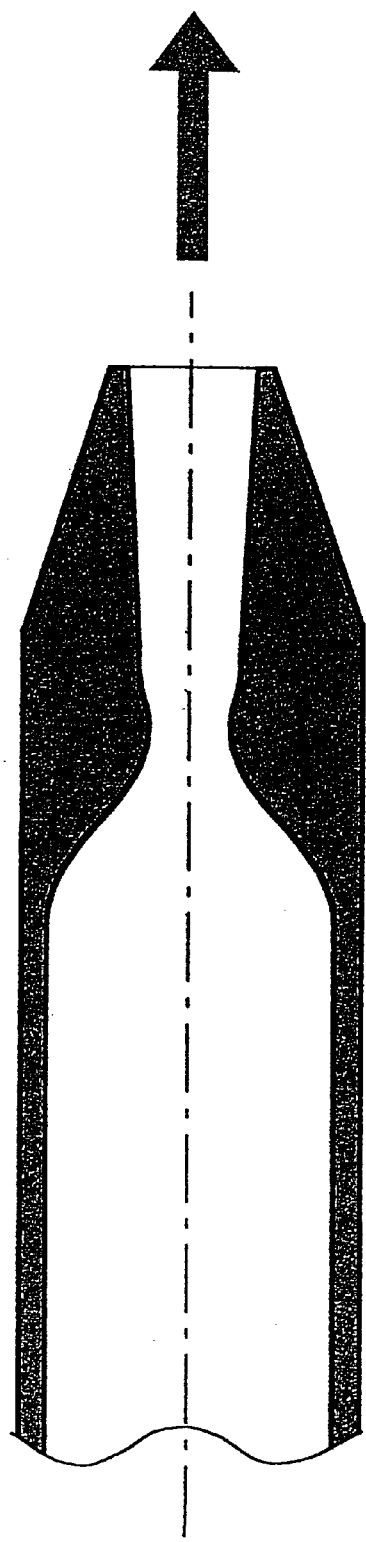
FIG. 5 is a cross-sectional view of the tip portion of the nozzle shown in FIG. 1.

FIG. 5 is a cross-sectional view of the tip portion of the nozzle 20 shown in FIG. 1. The nozzle 20 has a shape of a tapered tube, for accelerating liquid drops at the tip of the Laval nozzle shape, as shown in FIG. 5. For practical use, the length of the tapered tube is preferably 20–40 mm. Liquid drops jetted through the nozzle 20 at a supersonic speed can be further accelerated by passing through the tapered tube.

In the nozzle 20, a cleaning liquid and compressed air are supplied to the through hole and pure water is jetted through the tip of the nozzle 20, having the Laval nozzle shape, under a predetermined hydraulic pressure. Thereby at the tip of the nozzle 20, while the flow speed of the cleaning liquid increases, the pressure drops rapidly, and the cleaning liquid is adiabatically expanded to drop the temperature. Accordingly, the cleaning liquid supplied to the tip of the nozzle 20 transforms into ice particles because of the temperature drop, and at the same time, the ice particles are jetted out of the tip of the nozzle 20.

Under the nozzle 20 through which ice particles are jetted, the wafer 1, chucked by the spinner 22 and rotating with the spinner 22, is located. The cleaning is performed by making the ice particles collide with the surface of the wafer 1. The cleaning liquid may be jetted through the nozzle 20 without accelerating by compressed air.

In the wafer cleaning section 5, the discharge cup 24 surrounding and covering the periphery of the spinner 22 is provided so as to prevent the cleaning liquid jetted through the nozzle 20 from flying to the neighborhood. The discharge cup 24 has an opening in the upper surface so that the transfer robot 2 transferring the wafer 1 to the spinner 22 can easily perform the loading or unloading operation.

Figure 6:
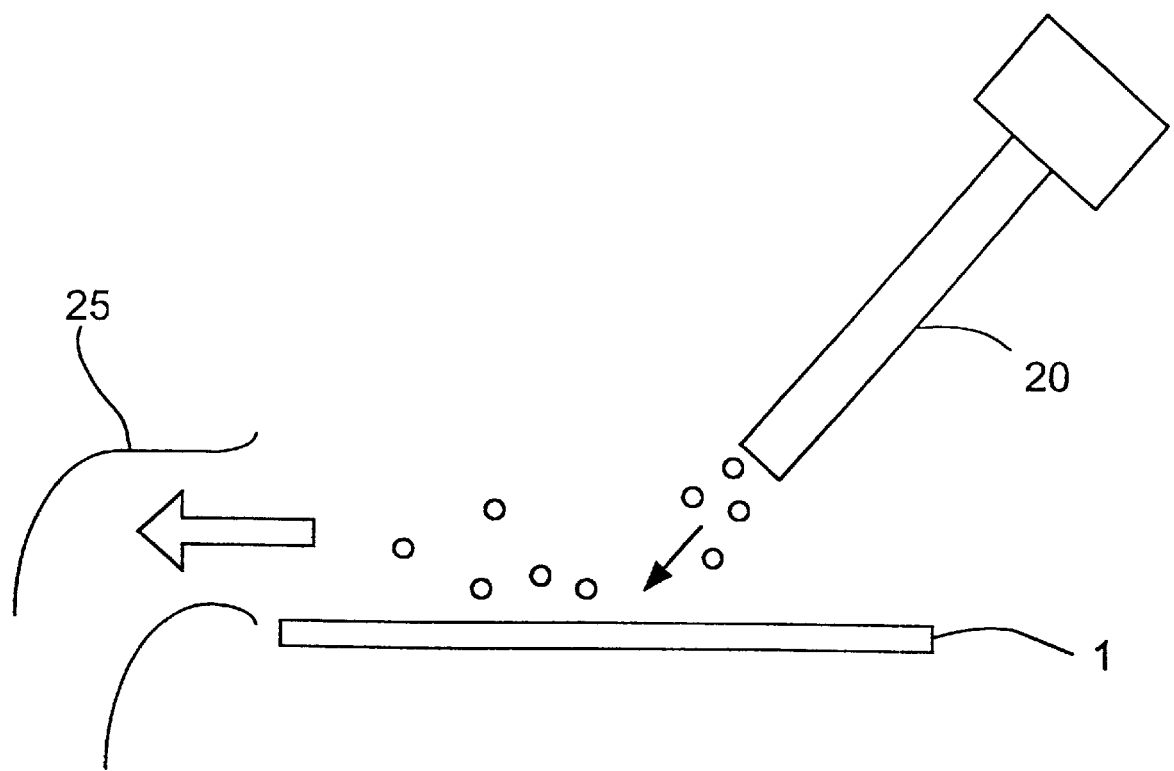
FIG. 6 is a schematic representation for illustrating the interior of the discharge cup shown in FIG. 1.

FIG. 6 is a schematic representation for illustrating the interior of the discharge cup 24 shown in FIG. 1. As shown in FIG. 6, the local discharge device 25 is provided on one side opposite to the nozzle 20 and near the wafer 1 chucked by the spinner 22. The local discharge device 25 is for preventing the liquid, which collided with the wafer 1 and scattered, from adhering again to the wafer 1, and for discharging the liquid jetted through the nozzle 20 on one side of the wafer 1 and scattered. The local discharge device 25 includes a mechanism for moving with the movement of the nozzle 20 in the cleaning operation so as to be kept at a position opposite to the nozzle 20. As a result, the wafer 1 is not contaminated again by the contaminants in the cleaning operation and is kept in a clean state.

Furthermore, in this embodiment, the cleaning liquid supply section 10 is provided for supplying a cleaning liquid to the nozzle 20. The cleaning liquid supply section 10 includes the tank 11 for pure water, the tank 12 for functional water, and the tank 13 for liquid. The tank 11 for pure water stores a cleaning liquid of pure water. The tank 12 for functional water stores a cleaning liquid such as ozonic water and electrolytically ionic water. The tank 13 for liquid chemicals stores a cleaning of a liquid chemical liquid. The tank 11 for pure water, the tank 12 for functional water and the tank 13 for liquid chemical are connected to the nozzle 20 through respective supply lines to supply various kinds of cleaning liquids. In this manner, because various kinds of cleaning liquids are stored in the cleaning liquid supply section 10, the cleaning can be performed with a suitable cleaning liquid in accordance with the condition of the contamination of the wafer 1.

The cleaning liquid supply section 10 is provided with the cleaning liquid mixing portion 14. The cleaning liquid mixing portion 14 is connected to the tank 11 for pure water, the tank 12 for functional water and the tank 13 for chemical liquid through respective supply lines. In the cleaning liquid mixing portion 14, various kinds of cleaning liquids from the tank 11 for pure water, the tank 12 for functional water and the tank 13 for liquid are stored and mixed at predetermined rates. The cleaning liquid mixing portion 14 is connected to the nozzle 20 through a supply line so as to supply the mixture of the cleaning liquids to the nozzle 20. Accordingly, the liquid mixture in which various kinds of cleaning liquids are mixed at predetermined rates, can also be selectively jetted through the nozzle 20, in addition to the various kinds of cleaning liquids such as pure water, functional water (such as ozonic water and electrolytically ionic water) and a liquid chemical. As a result, by jetting pure water, a functional water, a liquid chemical or the liquid mixture of them through the nozzle 20, organic contaminants on the surface of the wafer 1 are dissolved and metallic contaminants are removed.

The transfer robot cleaning section 6 is provided at the position opposite to the wafer cleaning section 5 for cleaning the holding portions 2a of the transfer robot 2. This wafer robot cleaning section 6 is for cleaning the holding portions 2a of the transfer robot 2 when the wafer 1 is cleaned because the transfer robot 2 accumulates the contaminants by repeating the chucking operation of the wafer 1. As a result, the wafer to be chucked can be prevented from being contaminated by the contaminants accumulated on the holding portions 2a.

The operation buttons 8 are provided near the loader 3 for operating the apparatus. The operation of the apparatus can be controlled by selecting the cleaning condition of the wafer 1 through the operation buttons 8. As a result, by selecting a predetermined cleaning condition through the operation buttons 8, the cleaning of the wafer 1 is performed in the apparatus following the cleaning condition. Furthermore, the personal computer 9 is provided near the operation buttons 8. This personal computer 9 is for displaying information obtained by simulating and analyzing the cleaning condition. By inputting the information through the operation buttons 8, the apparatus can be stably driven.

Next, the operation of cleaning the wafer by the wafer cleaning apparatus and the structure for holding and transferring a wafer used in the wafer cleaning apparatus according to the present invention described above, will be described in detail. First, a wafer cassette (not shown), receiving a plurality of wafers 1 transferred from a predetermined section, is put in the loader 3. Another wafers cassette receiving no wafer is put in the unloader 4.

After the wafer cassettes are put in the loader 3 and the unloader 4, the apparatus is started, the cleaning operation is simulated and analyzed with the personal computer 9, and then the cleaning condition according to the analysis information is input through the operation buttons 8. After completing the input through the operation buttons 8, the cleaning operation is started in the apparatus.

After the apparatus starts the cleaning operation, the transfer robot 2 chucks the peripheral edge of a wafer 1 and takes out it from the wafer cassette in the loader 3. The wafer 1 is transferred to the turning-over alignment section 7. The wafer 1 transferred to the turning-over alignment section 7 is turned over in the state that the peripheral edge of the wafer 1 is chucked, and the center of the wafer 1 is detected to center the wafer 1. This turned-over wafer 1 is transferred to the spinner 22 of the wafer cleaning section in the state that its back surface faces upward, and then put on the spinner 22.

The wafer 1 put on the spinner 22 is fixed by the manner that the peripheral edge of the wafer 1 is chucked by the spinner chucks 22a of the spinner 22. The wafer 1 is rotated with the spinner 22 by driving the drive source engaging with the spinner 22. As a result, because the spinner chucks 22a of the spinner 22 chuck the peripheral edge of the wafer 1, the central portion of the front surface of the wafer 1 is not contaminated.

The nozzle 20 is provided above the wafer 1 chucked by the spinner 22 and rotating with the spinner 22. The cleaning is performed by jetting a cleaning liquid through the nozzle 20. At this time, a selective supply to the nozzle 20 can be furnished by selecting a cleaning liquid suitable for the condition of the contamination of the surface of the wafer 1, among the tank 11 for pure water, the tank 12 for functional water, the tank 13 for chemical liquid and the cleaning liquid mixing portion 14, through the operation buttons 8. As a result, the wafer 1 can be effectively cleaned.

The cleaning liquid supplied to the nozzle 20 is further accelerated by passing it through the tapered tube for accelerating liquid drops formed at the tip and jetted. The cleaning liquid jetted collides with the surface of the wafer 1 to clean and then is discharged through the local discharge device 25.

After the wafer 1 is cleaned with the nozzle 20, it is dried by high speed rotation with the spinner 22. Next, after completing the drying, the wafer 1 is taken out from the spinner 22 by the transfer robot 2. This taken-out wafer 1 is transferred to the turning-over alignment section 7, in which the wafer 1 is turned over again. The wafer 1 with the front surface facing upward is again transferred to the spinner 22 of the wafer cleaning section 5 and put on it. The surface of the wafer 1 on the spinner 22 is again cleaned by jetting a cleaning liquid through the nozzle 20 and then dried.

While the wafer 1 is cleaned, the transfer robot 2 moves to the transfer robot cleaning section 6, in which the transfer robot 2 is cleaned with water and then dried. The transfer robot 2 is thus kept in a clean condition. Accordingly, because the transfer robot 2 is always cleaned in the transfer robot cleaning section 6 when the front or back surface of the wafer 1 is cleaned, the wafer 1 is not contaminated through the transfer robot 2. The wafer 1 cleaned and dried in the wafer cleaning section 5 is taken out from the spinner 22 by the transfer robot 2 and put in the wafer cassette in the unloader 4. By repeating a cleaning operation as described above, all of the wafers 1 received in the wafer cassette in the loader 3 are cleaned.

As a result, according to this embodiment, because the peripheral edge of the wafer 1 is always chucked and held in the transfer robot 2, the turning-over alignment section 7 and the spinner 22, the central portions of the front and back surfaces of the wafer 1 are not contaminated. Because both of the front and back surfaces of the wafer 1 can be cleaned by turning over the wafer 1 in the turning-over alignment section 7, the contaminants do not remain. Besides, because the holding portions 2a of the transfer robot 2 are cleaned in the transfer robot cleaning section 6, the wafer 1 is not contaminated through the transfer robot 2. Furthermore, because a cleaning liquid, such as pure water, a functional water, a liquid chemical or a liquid mixture liquid of them, is selectively jetted through the nozzle 20 in accordance with the condition of the contamination of the wafer 1, it becomes possible to effectively clean the wafer 1.

According to this embodiment, by forming the tip of the nozzle 20 having the Laval nozzle shape into a tapered tube for accelerating liquid drops, liquid drops jetted through the nozzle 20 at a supersonic speed can be further accelerated by passing through the tapered tube so the cleaning efficiency can be improved. Because the local discharge device 25 is provided on one side opposite to the nozzle 20, it becomes possible with prevent the liquid which collided to the surface of the wafer 1 and scattered from adhering again to the wafer 1.

Hereinabove, the embodiment of the wafer cleaning apparatus made by the present invention has been described in detail. The present invention is not limited to the above embodiment and can be changed within the range not departing from its gist.

For example, the cleaning liquid is not limited to pure water, functional water and liquid chemical and the cleaning liquid may be changed in accordance with the condition of the contamination of the wafer 1.

The tank 11 for pure water, the tank 12 for functional water and the tank 13 for liquid chemical are not limited to these three tanks, and the number of tanks may be increased as occasion demands.

As a result, according to a wafer cleaning apparatus of the present invention, because a cleaning liquid such as pure water, a functional water, a liquid chemical and the liquid mixture them, can selectively be jetted through the jet orifice, contaminants such as stable alien substances, minute alien substances and metallic contaminants adhering to the surface of the wafer can be effectively removed.

Because the wafer holding portions of the transfer means for transferring the wafer are always cleaned in the cleaning section and hold the peripheral edge of the wafer, the wafer is not contaminated by the contaminants adhering to the transfer means and the front and back surfaces of the wafer can be kept in the cleaned state. In addition, by providing the mechanism for turning over the wafer, because the front and back surfaces of the wafer can be cleaned, the contaminants do not remain on the back surface of the wafer after cleaning.

What is claimed is:

1. A wafer cleaning apparatus, in which a wafer is transferred by a transfer section and cleaned by having a cleaning liquid jetted to the wafer through a jet orifice having a Laval nozzle shape at a supersonic speed by accelerating with compressed air, comprising:

a computer and a supply section including a plurality of storing portions for storing various kinds of cleaning liquids for cleaning said wafer for selectively supplying the cleaning liquid, which will best clean said wafer, to said jet orifice in accordance with the state of contamination of said wafer.

2. A wafer cleaning apparatus according to claim 1, wherein said storing portions of said supply section comprises a storing portion for supplying pure water, a storing portion for supplying a functional water, and a storing portion for supplying a liquid chemical.

3. A wafer cleaning apparatus according to claim 2, wherein said supply section further includes means for supplying under pressure.

4. A wafer cleaning apparatus according to claim 2, wherein the tip portion of said jet orifice having the Laval nozzle shape is formed into a tapered tube for accelerating liquid drops.

5. A wafer cleaning apparatus according to claim 2, wherein said functional water includes ozonic water and electrolytically ionic water.

6. A wafer cleaning apparatus according to claim 1, wherein said supply section further includes a cleaning liquid mixing portion for storing said various kinds of cleaning liquids from said storing portions and mixing them at predetermined rates, and supplying a liquid mixture to said jet orifice.

7. A wafer cleaning apparatus according to claim 6, wherein said supply section further includes means for supplying under pressure.

8. A wafer cleaning apparatus according to claim 6, wherein the tip portion of said jet orifice having the Laval nozzle shape is formed into a tapered tube for accelerating liquid drops.

9. A wafer cleaning apparatus according to claim 1 wherein said supply section further includes means for supplying under pressure.

10. A wafer cleaning apparatus according to claim 1, wherein the tip portion of said jet orifice having the Laval nozzle shape is formed into a tapered tube for accelerating liquid drops.

11. A wafer cleaning apparatus, in which a wafer is transferred by a transfer section and cleaned by having a cleaning liquid jetted to the wafer through a jet orifice having a Laval nozzle shape at a supersonic speed by accelerating with compressed air, comprising:

the transfer section for holding the peripheral edge of said wafer and transferring said wafer to a predetermined place, a turning-over alignment section for centering said wafer transferred by said transfer section and turning over said wafer, a cleaning section in which a spinner is provided for chucking said wafer transferred by said transfer section and rotating said wafer, a cleaning liquid is jetted to said wafer chucked by said spinner through said jet orifice to clean said wafer, and a discharge port is provided for discharging minute liquid drops of said cleaning liquid scattered to one side opposite to said jet orifice, and a supply section which includes a plurality of storing portions for storing various kinds of cleaning liquids for cleaning said wafer so as to supply selectively any of said cleaning liquids to said jet orifice under pressure in accordance with the condition of the contamination of said wafer.

12. A wafer cleaning apparatus according to claim 11, wherein said storing portions of said supply section comprises a storing portion for supplying pure water, a storing portion for supplying a functional water, and a storing portion for supplying a liquid chemical.

13. A wafer cleaning apparatus according to claim 12, wherein said functional water includes ozonic water and electrolytically ionic water.

14. A wafer cleaning apparatus according to claim 11, wherein said supply section further includes a cleaning liquid mixing portion for storing said various kinds of cleaning liquids from said storing portions and mixing them at predetermined rates, and supplying a liquid mixture to said jet orifice.

15. A wafer cleaning apparatus according to claim 11, further comprising a transfer section cleaning section for cleaning wafer holding portions of said transfer section for holding the peripheral edge of said wafer.

16. A wafer cleaning apparatus according to claim 11, wherein said wafer is centered and turned over in said turning-over alignment section in a state that the peripheral edge of said wafer is chucked.

17. A wafer cleaning apparatus according to claim 11, wherein said spinner of said cleaning section rotates in a state of chucking the peripheral edge of said wafer.

18. A wafer cleaning apparatus according to claim 11, wherein said discharge port of said cleaning section is provided with a local discharge device.

19. A wafer cleaning apparatus according to claim 18, wherein said local discharge device has a mechanism for moving with the movement of said jet orifice having the Laval nozzle shape.

20. A wafer cleaning apparatus according to claim 11, wherein said supply section further includes means for supplying under pressure.

21. A wafer cleaning apparatus according to claim 11, wherein the tip portion of said jet orifice having the Laval nozzle shape is formed into a tapered tube for accelerating liquid drops.

* * * * *

UNITED STATES PATENT AND TRADEMARK OFFICE
CERTIFICATE OF CORRECTION

PATENT NO. : 6,129,100
DATED : October 10, 2000
INVENTOR(S) : Kitagawa, et al.

It is certified that error appears in the above-identified patent and that said Letters Patent is hereby corrected as shown below:

<u>Title page,</u>
Item [73] Assignee, change the assignee from "Hoya Corporation, Japan" to -- SPC Electronics, Japan --.

Signed and Sealed this

Sixth Day of November, 2001

Attest:

NICHOLAS P. GODICI
Attesting Officer
Acting Director of the United States Patent and Trademark Office